United States Patent
Tseng et al.

(10) Patent No.: US 9,219,479 B2
(45) Date of Patent: *Dec. 22, 2015

(54) THROUGH SILICON VIA REPAIR CIRCUIT OF SEMICONDUCTOR APPARATUS

(71) Applicant: Industrial Technology Research Institute, Hsinchu (TW)

(72) Inventors: Pei-Ling Tseng, Miaoli County (TW); Keng-Li Su, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 218 days.

This patent is subject to a terminal disclaimer.

(21) Appl. No.: 13/867,122

(22) Filed: Apr. 21, 2013

(65) Prior Publication Data
US 2014/0145753 A1 May 29, 2014

(30) Foreign Application Priority Data
Nov. 28, 2012 (TW) .............................. 101144576 A

(51) Int. Cl.
H03K 19/00 (2006.01)
H03K 19/003 (2006.01)

(52) U.S. Cl.
CPC ...... *H03K 19/003* (2013.01); *H01L 2924/0002* (2013.01)

(58) Field of Classification Search
CPC .............. H01L 23/481; H01L 25/0657; H01L 2225/06513; H01L 2225/06544; H01L 2224/16145; H01L 21/76831; H03K 19/003; H03K 17/00; H03K 19/0008; H03K 19/0175; H03K 19/1776; H03K 19/17796
USPC ........ 326/82, 41, 47, 9, 10, 16; 257/758, 777, 257/530, 531, 774; 716/119, 126; 324/762.03
See application file for complete search history.

(56) References Cited

U.S. PATENT DOCUMENTS 6,784,685 B2   8/2004  Chao et al.
7,969,193 B1 *  6/2011  Wu et al. .................... 326/82

(Continued)

FOREIGN PATENT DOCUMENTS

TW   472266   1/2002
TW   503551   9/2002

(Continued)

OTHER PUBLICATIONS

Kang et al., "8 Gb 3-D DDR3 DRAM Using Through-Silicon-Via Technology", IEEE Journal of Solid-State Circuits, Jan. 2010, vol. 45, p. 111-p. 119.

(Continued)

*Primary Examiner* — Alexander H Taningco
*Assistant Examiner* — Christopher Lo
(74) *Attorney, Agent, or Firm* — Jianq Chyun IP Office

(57) ABSTRACT

A through silicon via (TSV) repair circuit of a semiconductor apparatus is provided. The TSV repair circuit includes a first chip, at least one second chip, at least two TSVs, at least two data path circuits, and an output logic circuit. Each data path circuit includes an input driving circuit, a short-circuit detection circuit, a bias circuit, and a leakage current cancellation circuit. The input driving circuit transforms an input signal into a pending signal and transmits the pending signal to a first terminal of the corresponding TSV. The short-circuit detection circuit detects a short circuit between the corresponding TSV and a silicon substrate according to the input signal and the first terminal of the TSV and generates a short-circuit detection output signal. The leakage current cancellation circuit prevents a leakage current produced by a first level voltage from entering the silicon substrate according to the short-circuit detection output signal.

45 Claims, 9 Drawing Sheets

(56) References Cited

U.S. PATENT DOCUMENTS

| | | |
|---|---|---|
| 7,977,962 B2 | 7/2011 | Hargan et al. |
| 8,110,892 B2 | 2/2012 | Lee et al. |
| 8,153,499 B2 | 4/2012 | Or-Bach et al. |
| 2010/0060310 A1 | 3/2010 | Laisne et al. |
| 2010/0127758 A1 | 5/2010 | Hollis |
| 2010/0295600 A1 | 11/2010 | Kim et al. |
| 2011/0080184 A1 | 4/2011 | Wu et al. |
| 2011/0080185 A1 | 4/2011 | Wu et al. |
| 2014/0184322 A1* | 7/2014 | Tseng et al. ............ 327/566 |
| 2014/0185174 A1* | 7/2014 | Tseng et al. ............ 361/91.1 |

FOREIGN PATENT DOCUMENTS

| | | |
|---|---|---|
| TW | 201025472 | 7/2010 |
| TW | 201108380 | 3/2011 |

OTHER PUBLICATIONS

Loi et al., "A Low-overhead Fault Tolerance Scheme for TSV-based 3D Network on Chip Links", IEEE/ACM International Conference on Computer-Aided Design, 2008, Nov. 2008, p. 598-p. 602.

Jiang et al., "On effective TSV repair for 3D-stacked ICs ", Design, Automation & Test in Europe Conference & Exhibition (Date), 2012, Mar. 2012, p. 793-p. 798.

Tsai et al., "Through Silicon Via(TSV) defect/pinhole self test circuit for 3D-IC", IEEE International Conference on 3D System Integration, 2009, Sep. 2009, p. 1-p. 8.

Hsieh et al, "TSV redundancy: Architecture and design issues in 3D IC", Design, Automation & Test in Europe Conference & Exhibition (Date), 2010, Mar. 2010, p. 166-p. 171.

"Notice of Allowance of Taiwan Counterpart Application", issued on Nov. 28, 2014, p. 1-p. 4.

* cited by examiner

THROUGH SILICON VIA REPAIR CIRCUIT OF SEMICONDUCTOR APPARATUS

CROSS-REFERENCE TO RELATED APPLICATION

This application claims the priority benefit of Taiwan application serial no. 101144576, filed on Nov. 28, 2012. The entirety of the above-mentioned patent application is hereby incorporated by reference herein and made a part of this specification.

TECHNICAL FIELD

The technical field relates to a through silicon via (TSV) repair circuit of a semiconductor apparatus adapted to a chip stacking technique.

BACKGROUND

Due to the constant increase in the number of transistors in each integrated circuit (IC), the surface area of each chip is increased. Accordingly, the delay time of each signal is prolonged, and the power consumption is increased. To effectively resolve this problem, a three-dimensional IC (3DIC) stacking technique is being developed for reducing the delay time of each signal and decreasing the power consumption. In the 3DIC stacking technique, multiple ICs are vertically stacked, and through silicon vias (TSVs) running through silicon substrates are formed for transmitting signals and supply voltages between different ICs, so that the size of the chip is effectively reduced.

The 3DIC stacking technique has three major steps. The first step is to form TSV channels and fill in a conductive metal, the second step is wafer thinning, and the third step is chip stacking and integration. In the first step, due to the limitation of existing fabrication techniques, the thin insulating film (for example, SiO2) serving as the sidewall of a TSV may be broken or contaminated with impurities during the fabrication process, and as a result, an open circuit of the TSV or a short circuit of the silicon substrate may be caused. Besides, in the third step, when multiple ICs are stacked and integrated, the TSV may be improperly connected and open-circuited (i.e., the TSV cannot provide a valid path for transmitting signals among different ICs) due to a small offset of the ICs.

In the conventional design of a 2DIC, multiple paths are formed for transmitting a same signal at the same time, so as to make sure that data is correctly transmitted. However, in the 3DIC stacking technique, if a TSV and the silicon substrate are short-circuited, the leakage current produced by the supply voltage will enter the silicon substrate through the TSV, and accordingly the voltage level of the entire silicon substrate will drift and become unstable. As a result, signals transmitted in other TSVs may not be correctly transmitted due to the drifted voltage level of the silicon substrate. Thereby, many manufacturers in the 3DIC field are trying to develop a data transmission path circuit which can automatically detect any TSV short circuit and comes with a data self-repair function.

SUMMARY

The disclosure is directed to a through silicon via (TSV) repair circuit of a semiconductor apparatus, in which a short circuit between a TSV and a silicon substrate is automatically detected to prevent a leakage current from entering the silicon substrate, and a transmitted signal is self-repaired into a correct output signal to allow a three-dimensional integrated circuit (3DIC) to work properly.

The disclosure provides a TSV repair circuit of a semiconductor apparatus. The TSV repair circuit includes a first chip, at least one second chip, at least two TSVs, at least two data path circuits, and output logic circuit. The first chip and the at least one second chip are vertically stacked. The at least two TSVs run through a silicon substrate for transmitting data between the first chip and the at least one second chip. The at least two data path circuits are disposed at the first chip and are respectively connected to the at least two TSVs. Each data path circuit includes an input driving circuit, a short-circuit detection circuit, a bias circuit, and a leakage current cancellation circuit. The input driving circuit receives an input signal, transforms the input signal into a pending signal according to a first level voltage and a second level voltage, and transmits the pending signal to a first terminal of the corresponding TSV. The short-circuit detection circuit is connected to the first terminal of the corresponding TSV. The short-circuit detection circuit detects a short circuit between the corresponding TSV and a silicon substrate according to the input signal and the first terminal of the corresponding TSV and generates a short-circuit detection output signal. The leakage current cancellation circuit is connected to the short-circuit detection circuit and the input driving circuit. The leakage current cancellation circuit prevents the leakage current produced by the first level voltage from entering the silicon substrate according to the short-circuit detection output signal. The output logic circuit is disposed at the at least one second chip. At least two input terminals of the output logic circuit are respectively connected to second terminals of at least one of the TSVs for respectively receiving a plurality of transmission signals, and the output logic circuit generates an output signal according to the transmission signals.

The disclosure provides a TSV repair circuit of a semiconductor apparatus. The TSV repair circuit includes a plurality of chips, at least two TSVs, at least two data path circuits, and an output logic circuit. The chips are stacked. The at least two TSVs run through a silicon substrate for transmitting data among the chips. The at least two data path circuits are disposed at any one of the chips, and the at least two data path circuits are respectively connected to the at least two TSVs. The chips not disposed with the at least two data path circuits and the adjacent chips transmit data to each other through the at least two TSVs running through the silicon substrate. Each data path circuit includes an input driving circuit, a short-circuit detection circuit, a bias circuit, and a leakage current cancellation circuit. The input driving circuit receives an input signal, transforms the input signal into a pending signal according to a first level voltage and a second level voltage, and transmits the pending signal to a first terminal of the corresponding TSV. The short-circuit detection circuit is connected to the first terminal of the corresponding TSV. The short-circuit detection circuit detects a short circuit between the corresponding TSV and the silicon substrate according to the input signal and the first terminal of the corresponding TSV and generates a short-circuit detection output signal. The leakage current cancellation circuit is connected to the short-circuit detection circuit and the input driving circuit. The leakage current cancellation circuit prevents a leakage current produced by the first level voltage from entering the silicon substrate according to the short-circuit detection output signal. The output logic circuit is disposed at at least one of the chips. At least two input terminals of the output logic circuit are respectively connected to second terminals of at least one of the TSVs for respectively receiving a plurality of transmission signals, and the output logic circuit generates an output signal according to the transmission signals.

The disclosure provides a TSV repair circuit of a semiconductor apparatus. The TSV repair circuit includes a plurality of chips, a plurality of TSVs, a plurality of data path circuits, and at least one output logic circuit. The chips are stacked. The TSVs run through a silicon substrate for transmitting data among the chips. The data path circuits are disposed at each of the chips and are respectively connected to the TSVs. Each data path circuit includes an input driving circuit, a short-circuit detection circuit, a bias circuit, and a leakage current cancellation circuit. The input driving circuit receives an input signal, transforms the input signal into a pending signal according to a first level voltage and a second level voltage, and transmits the pending signal to a first terminal of the corresponding TSV. The short-circuit detection circuit is connected to the first terminal of the corresponding TSV. The short-circuit detection circuit detects a short circuit between the corresponding TSV and the silicon substrate according to the input signal and the first terminal of the corresponding TSV and generates a short-circuit detection output signal. The leakage current cancellation circuit is connected to the short-circuit detection circuit and the input driving circuit. The leakage current cancellation circuit prevents a leakage current produced by the first level voltage from entering the silicon substrate according to the short-circuit detection output signal. The output logic circuit is disposed at the chips. An input terminal of the output logic circuit is respectively connected to second terminals of the TSVs for respectively receiving a plurality of transmission signals, and the output logic circuit generates an output signal according to the transmission signals. Input terminals of the data path circuits in the chips are connected to an output terminal of the output logic circuit in the chips.

As described above, in a TSV repair circuit provided by an embodiment of the disclosure, a short circuit between a TSV and a silicon substrate is detected according to an input signal and the voltage level on a first terminal of the TSV, and when the short circuit is detected, a supply voltage is instantly shut off and the first terminal of the TSV is connected to a ground voltage, so that a leakage current is prevented from entering the silicon substrate and the voltage level on the silicon substrate is prevented from drifting. In addition, an output logic circuit can restore a plurality of transmitted signals into correct signals so that a semiconductor apparatus (for example, a 3DIC) can work properly even when some TSVs are short-circuited.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
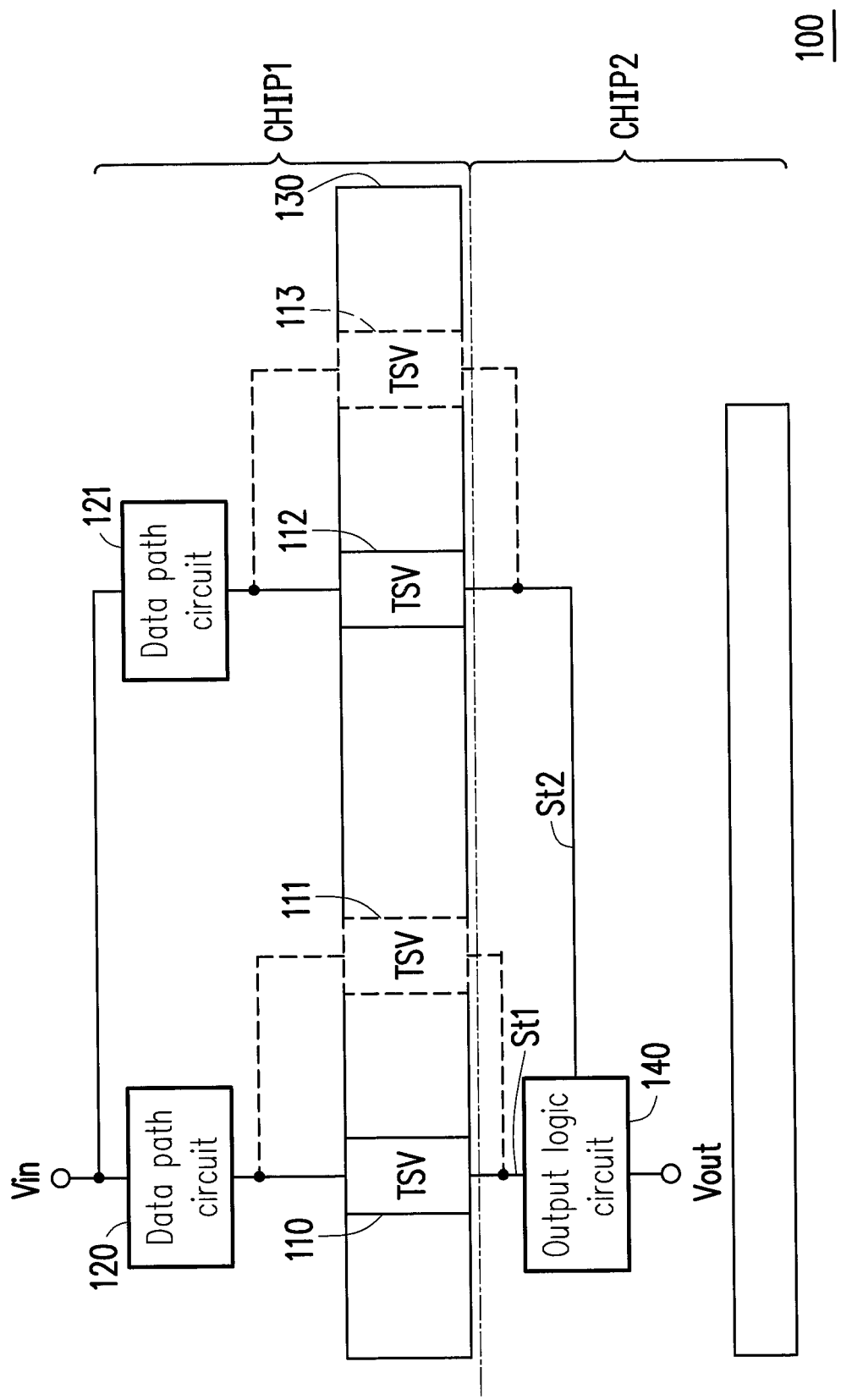
FIG. 1 is a diagram of a through silicon via (TSV) repair circuit of a semiconductor apparatus according to a first embodiment of the disclosure.

FIG. 1 is a diagram of a through silicon via (TSV) repair circuit 100 of a semiconductor apparatus according to a first embodiment of the disclosure. As shown in FIG. 1, the TSV repair circuit 100 includes at least two vertically stacked chips CHIP1 and CHIP2, at least two sets of TSVs 110-111 and 112-113, at least two data path circuits 120 and 121, and an output logic circuit 140. In the present embodiment, the first set of TSVs 110-111 is corresponding to the data path circuit 120, and the second set of TSVs 112-113 is corresponding to the data path circuit 121.

In the embodiment illustrated in FIG. 1, only the first chip CHIP1 and the second chip CHIP2 are vertically stacked. However, the disclosure is not limited thereto. One implementing the present embodiment can vertically stack more chips to form a semiconductor apparatus (for example, a three-dimensional integrated circuit (3DIC)) and serve two of the chips which are about to transmit data respectively as the first chip CHIP1 and the second chip CHIP2. Herein there may be one or more other chips between the first chip CHIP1 and the second chip CHIP2, and there may also be one or more second chips CHIP2 and all these second chips CHIP2 receive an output signal Vout. In the present embodiment, the TSV repair circuit 100 is expected to properly and unidirectionally transmit an input signal Vin of the first chip CHIP1 to one or more second chips CHIP2. Even though only the first chip CHIP1 and the second chip CHIP2 are vertically stacked in FIG. 1, in the present embodiment, more chips may be vertically stacked and two of the chips which are about to transmit data may be considered the first chip CHIP1 and the second chip CHIP2. Herein one or more other chips may exist between the first chip CHIP1 and the second chip CHIP2.

On the other hand, the first embodiment is described by assuming two data paths (i.e., the data path circuits 120 and 121 respectively corresponding to the first set of TSVs 110-111 and the second set of TSVs 112-113). However, one implementing the present embodiment may also adopt another one or more data path circuits and corresponding TSVs to increase the data transmission accuracy.

The TSVs 110-113 run through a silicon substrate 130 for transmitting data between the first chip CHIP1 and the second chip CHIP2. The data path circuit 120 is disposed at the first chip CHIP1 and connected to the TSV 110. The TSVs 110-113 in FIG. 1 run through the silicon substrate 130 of the first chip CHIP1. If in the present embodiment, multiple chips are stacked to form a semiconductor apparatus (for example, a 3DIC), the TSV 110 runs through the silicon substrates of the corresponding chips in order to allow signals to be transmitted to the second chip CHIP2. The data path circuit 120 of the first chip CHIP1 is connected to the first terminals of the first set of TSVs 110-111 to transmit the input signal Vin through the TSVs 110-111. The data path circuit 121 is connected to the first terminals of the second set of TSVs 112-113 to transmit the input signal Vin through the TSVs 112-113. The output logic circuit 140 of the second chip CHIP2 is respectively connected to the second terminals of the first set of TSVs 110-111 and the second terminals of the second set of TSVs 112-113 and receives transmission signals St1 and St2, so as to receive the output signal Vout through the output logic circuit 140.

In a general application of the present embodiment, data is transmitted through a single data path circuit 120 corresponding to a single TSV 110. However, because the sidewall of the TSV is made of a thin insulating film (SiO2) and due to the limitation of existing fabrication techniques, the sidewall of the TSV 110 may be broken or contaminated with impurities. As a result, the data transmission through the single TSV 110 may not be stable. Thus, those implementing the present embodiment can associate a single data path circuit 120 to multiple TSVs (for example, more than two TSVs) according to the actual requirement. For example, the TSVs 111 and 113 marked with dotted lines in FIG. 1 are disposed as different paths for transmitting data. In addition, in other embodiments of the disclosure, the same input signal Vin may be transmitted at the same time through data path circuits 120 and 121 respectively corresponding to different TSVs, so that a data repair purpose can be accomplished.

Figure 2:
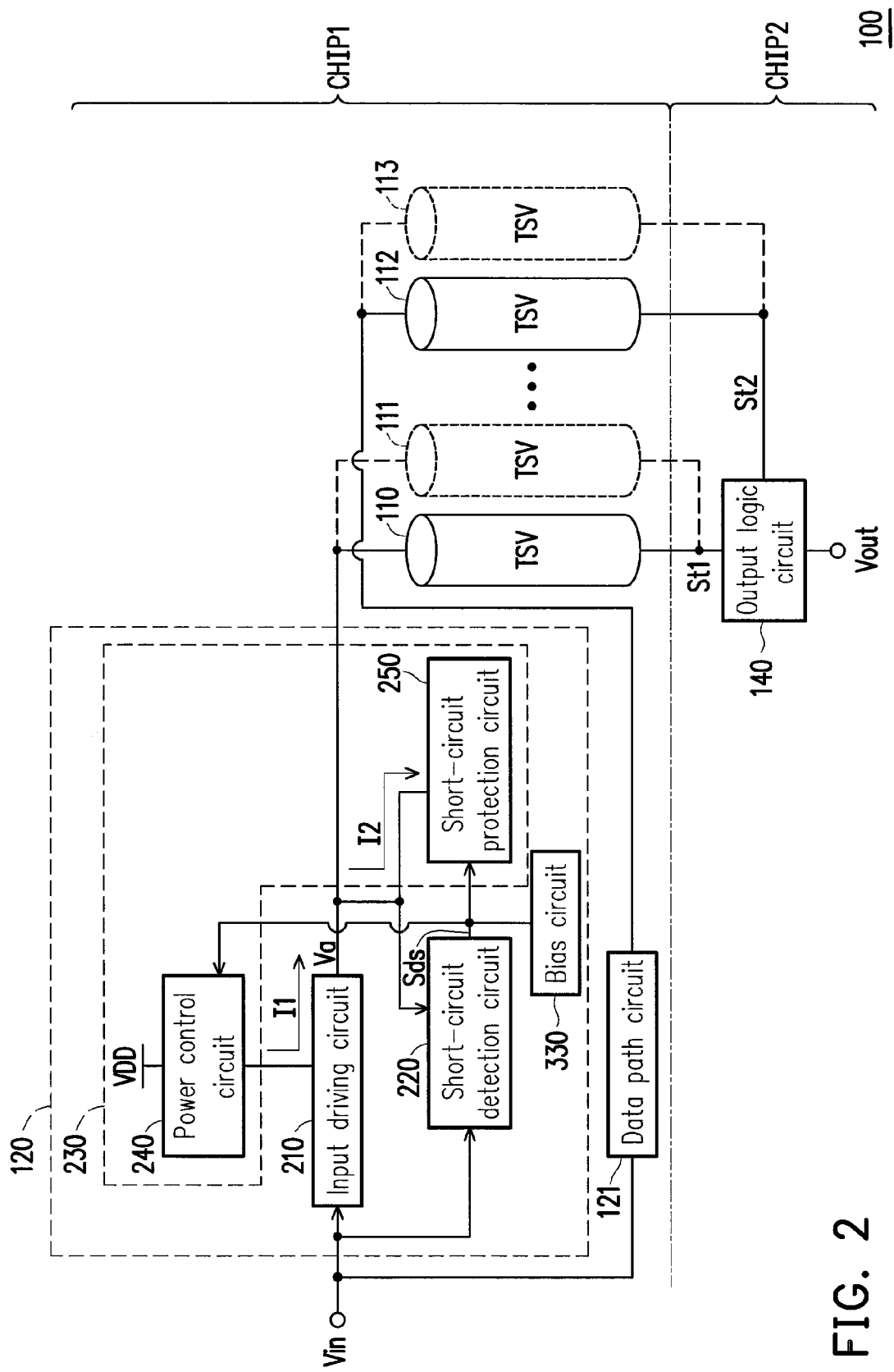
FIG. 2 is a schematic block diagram of a TSV repair circuit of a semiconductor apparatus according to the first embodiment of the disclosure.

FIG. 2 is a schematic block diagram of the TSV repair circuit 100 of a semiconductor apparatus according to the first embodiment of the disclosure. In the present embodiment, the data path circuit 120 is corresponding to a single TSV 110. However, those implementing the present embodiment may also adopt the TSV 111 marked with dotted lines in FIG. 2 to increase the data transmission accuracy. Similarly, the data path circuit 121 is corresponding to the TSVs 112 and 113. Because the data path circuits 120 and 121 have similar circuit structures, below, the data path circuit 120 will be described as an example, while the data path circuit 121 can be referred to related descriptions of the data path circuit 120.

The data path circuit 120 includes an input driving circuit 210, a short-circuit detection circuit 220, a bias circuit 330, and a leakage current cancellation circuit 230. The input driving circuit 210 receives the input signal Vin and enhances the driving ability of the input signal Vin. The driving ability of the input signal Vin is enhanced to prevent any data error caused by signal attenuation when the input signal Vin is transmitted. The input driving circuit 210 transforms the input signal Vin into a pending signal Va according to a first level voltage (for example, a supply voltage VDD) and a second level voltage (for example, a ground voltage GND) and transmits the pending signal Va to the first terminal of the TSV 110. The TSV 110 then transmits the pending signal Va to the second chip CHIP2 as the output signal Vout. Herein the voltage level of the first level voltage (i.e., the supply voltage VDD) is higher than that of the second level voltage (i.e., the ground voltage GND).

However, if the insulation layer of the TSV 110 is broken or contaminated by impurities during the fabrication process and accordingly a short circuit is produced between the TSV 110 and the silicon substrate of the first chip CHIP1, in the present embodiment, the short-circuit detection circuit 220 is configured to automatically detect the short circuit between the TSV 110 and the silicon substrate, and the leakage current cancellation circuit 230 is configured to prevent the leakage current from entering the silicon substrate. To be specific, the short-circuit detection circuit 220 is connected to the first terminal of the TSV 110. The short-circuit detection circuit 220 detects the short circuit between the TSV 110 and the silicon substrate according to the input signal Vin and the first terminal of the TSV 110 and generates a short-circuit detection output signal Sds.

The leakage current cancellation circuit 230 is connected to the short-circuit detection circuit 220 and the input driving circuit 210. The leakage current cancellation circuit 230 prevents a leakage current produced by the first level voltage (i.e., the supply voltage VDD) from entering the silicon substrate according to the short-circuit detection output signal Sds. Namely, when the short-circuit detection circuit 220 determines that a short circuit occurs between the TSV 110 and the silicon substrate, the leakage current cancellation circuit 230 instantly shuts off the power supply through a power control circuit 240 and prevents the leakage current from entering the silicon substrate by, for example, connecting the first terminal of the TSV 110 to the ground voltage GND through a short-circuit protection circuit 250, so as to prevent the voltage level on the silicon substrate from drifting.

The bias circuit 330 is connected to the short-circuit detection circuit 220 and the leakage current cancellation circuit 230. The bias circuit 330 first turns on the power switch of the power control circuit 240 in the leakage current cancellation circuit 230 (i.e., enables the supply voltage VDD) when the TSV repair circuit 100 just starts working. When the input signal Vin is received, if the short-circuit detection circuit 220 detects a short circuit between the TSV 110 (or the TSV 111) and the silicon substrate, the short-circuit detection circuit 220 adjusts the short-circuit detection output signal Sds to control the leakage current cancellation circuit 230 to turn off the power control circuit 240 in the leakage current cancellation circuit 230 and turn on the short-circuit protection circuit 250.

In the present embodiment, the leakage current cancellation circuit 230 includes the power control circuit 240 and/or the short-circuit protection circuit 250. In an application, both or only one of the power control circuit 240 and the short-circuit protection circuit 250 can be implemented. The power control circuit 240 is connected to the short-circuit detection circuit 220. The power control circuit 240 receives the short-circuit detection output signal Sds and determines not to supply the first level voltage (i.e., the supply voltage VDD) to the input driving circuit 210 according to the short-circuit detection output signal Sds. Namely, when the short-circuit detection circuit 220 determines that a short circuit occurs between the TSV 110 and the silicon substrate, the power control circuit 240 stops supplying the first level voltage (i.e., the supply voltage VDD) to the input driving circuit 210, so that the leakage current (for example, the leakage current I1 in FIG. 2) produced by the supply voltage VDD when the input driving circuit 210 transmits the input signal Vin is not supplied to the TSV 110 and the leakage current is prevented from entering the silicon substrate of the TSV 110.

The short-circuit protection circuit 250 is connected to the short-circuit detection circuit 220 and the first terminal of the TSV 110. The short-circuit protection circuit 250 determines to connect the first terminal of the TSV 110 to the ground voltage GND according to the short-circuit detection output signal Sds. Namely, when the short-circuit detection circuit 220 determines that a short circuit occurs between the TSV 110 and the silicon substrate, the short-circuit protection circuit 250 connects the first terminal of the TSV 110 to the ground voltage GND, so that the leakage current (for example, the leakage current I2 in FIG. 2) produced by the supply voltage VDD can be guided by the short-circuit protection circuit 250 to the ground and the leakage current is prevented from entering the silicon substrate of the TSV 110. The input terminal of the output logic circuit 140 is respectively connected to the second terminals of the first set of TSVs 110-111 and the second terminals of the second set of TSVs 112-113 for respectively receiving transmission signals (for example, respectively receiving a first transmission signal St1 from the first set of TSVs 110-111 and a second transmission signal St2 from the second set of TSVs 112-113). The output logic circuit 140 generates the output signal Vout according to the transmission signals St1 and St2.

Figure 3:
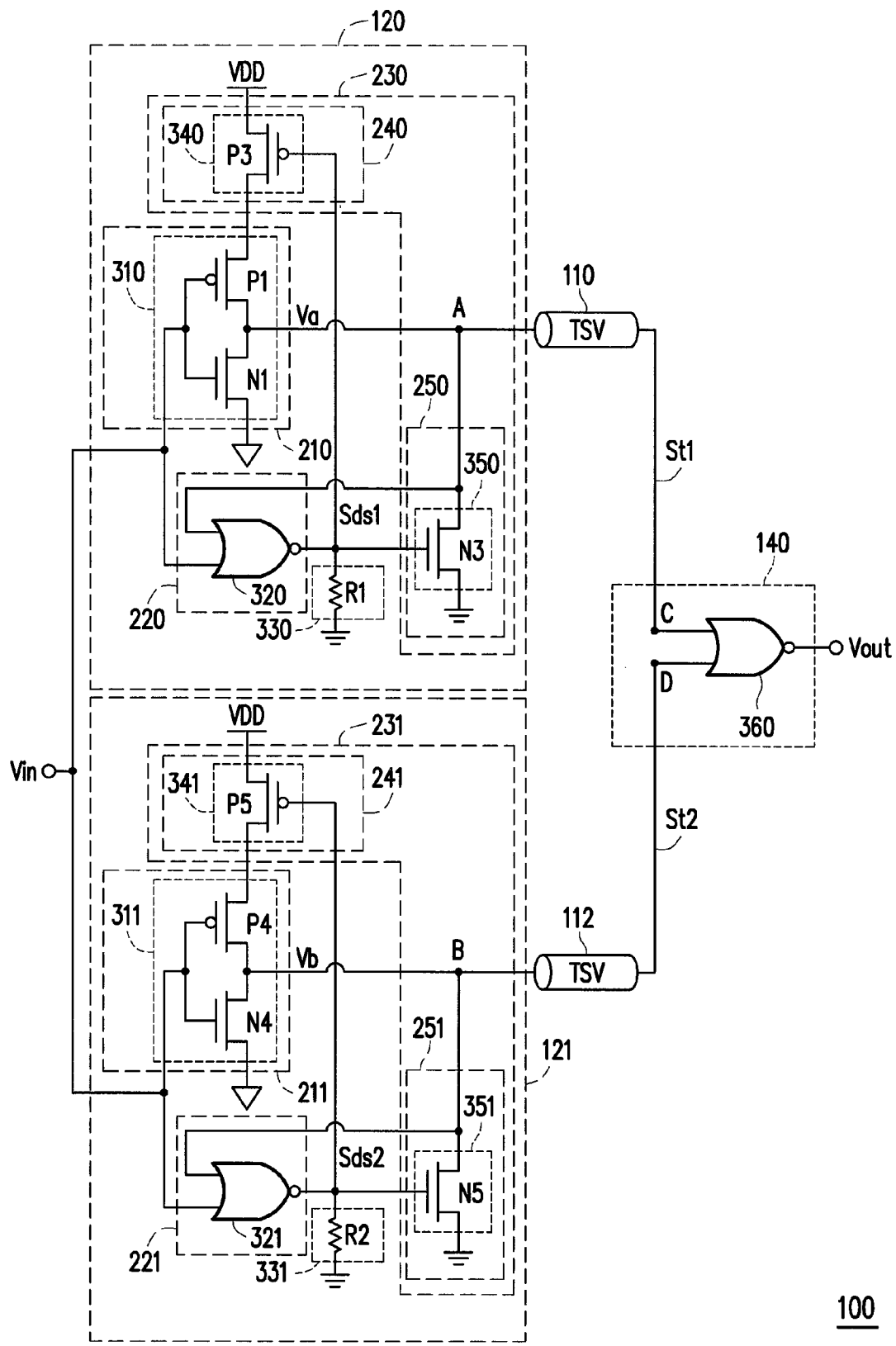
FIG. 3 illustrates an example of a TSV repair circuit of a semiconductor apparatus according to the first embodiment of the disclosure.

FIG. 3 illustrates an example of the TSV repair circuit 100 of a semiconductor apparatus according to the first embodiment of the disclosure. Namely, FIG. 3 illustrates the circuit structures of various devices in FIG. 2. Because the data path circuits 120-121 have the same circuit structure and the input driving circuits 210 and 211, the short-circuit detection circuits 220 and 221, the bias circuits 330 and 331, and the leakage current cancellation circuits 230 and 231 are similar circuits, components of the data path circuit 120 will be described in detail as examples, and components of the data path circuit 121 can be understood by referring to following descriptions. The input driving circuit 210 includes a signal inverter 310 served as an input-stage circuit. The signal inverter 310 is composed of an N-type metal-oxide-semiconductor field-effect transistor (MOSFET) N1 and a P-type MOSFET P1. The control terminals (gates) of the transistors N1 and P1 receive an input signal and are served as a first terminal of the signal inverter 310. The first terminal (source) of the P-type MOSFET P1 receives a drain voltage (for example, the supply voltage VDD) from the power control circuit 340 and is served as a power supply terminal of the signal inverter 310. The second terminal (drain) of the P-type MOSFET P1 is connected to the first terminal (drain) of the N-type MOSFET N1 and is served as an output terminal of the signal inverter 310. The output terminal of the signal inverter 310 is connected to the first terminal of the TSV 110 (i.e., the node A in FIG. 3). The second terminal (source) of the N-type MOSFET N1 receives the ground voltage GND. Thus, the pending signal Va is inverse to the input signal Vin.

The short-circuit detection circuit 220 includes a NOR gate 320. A first receiving terminal of the NOR gate 320 is connected to the first terminal (i.e., the node A) of the TSV 110, a second receiving terminal of the NOR gate 320 receives the input signal Vin, and an output terminal of the NOR gate 320 generates the short-circuit detection output signal Sds. The short-circuit detection circuit 220 further includes the bias circuit 330. The first terminal of the bias circuit 330 is connected to the output terminal of the short-circuit detection circuit 220 (i.e., the output terminal of the NOR gate 320) to maintain the bias of the short-circuit detection output signal Sds. In the present embodiment, the bias circuit 330 includes a biasing resistor R1. The first end of the biasing resistor R1 is respectively connected to the output terminal of the short-circuit detection circuit 220, and the second end of the biasing resistor R1 receives the second level voltage (i.e., the ground voltage GND).

Figure 4A:
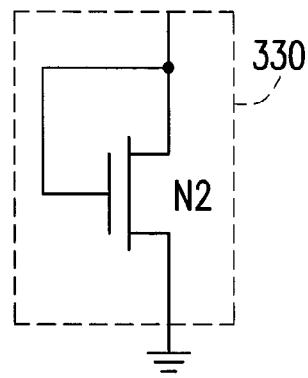
FIG. 4A and FIG. 4B are circuit diagrams of a bias circuit in FIG. 3 according to other embodiments.
Figure 4B:
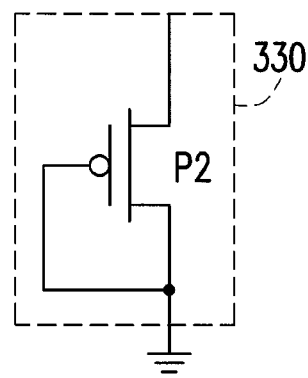

In other embodiments, the bias circuit 330 may also be implemented by using a P-type MOSFET or an N-type MOSFET or may even be omitted. FIG. 4A and FIG. 4B are circuit diagrams of the bias circuit 330 in FIG. 3 according to other embodiments. The bias circuit 330 in FIG. 4A includes an N-type MOSFET N2. The drain and gate of the N-type MOSFET N2 are connected to the output terminal of the short-circuit detection circuit 220 in FIG. 3, and the source of the N-type MOSFET N2 receives the ground voltage GND so that the bias circuit 330 can have sufficient biasing resistance. The bias circuit 330 in FIG. 4B includes a P-type MOSFET P2. The source of the P-type MOSFET P2 is connected to the output terminal of the short-circuit detection circuit 220 in FIG. 3, and the drain and gate of the P-type MOSFET P2 receive the ground voltage GND so that the bias circuit 330 can have sufficient biasing resistance.

Figure 4C:
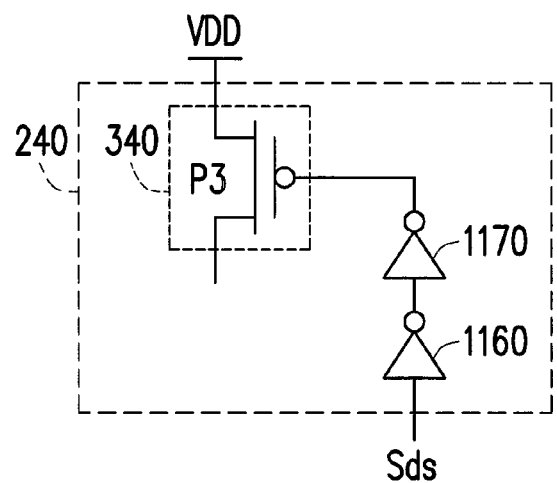
FIG. 4C is a circuit diagram of a power control circuit in FIG. 3 according to another embodiment.

Referring to FIG. 3, the power control circuit 240 includes a first switch 340. In the present embodiment, the first switch 340 is implemented by using a P-type MOSFET P3. The source of the P-type MOSFET P3 receives the supply voltage VDD, the drain of the P-type MOSFET P3 is connected to the power supply terminal of the input driving circuit 210, and the gate of the P-type MOSFET P3 receives the short-circuit detection output signal Sds. In other embodiments, the power control circuit 240 may also be as that illustrated in FIG. 4C. FIG. 4C is a circuit diagram of the power control circuit 240 in FIG. 3 according to another embodiment. The power control circuit 240 further includes a first inverter 1160 and a second inverter 1170. The input terminal of the first inverter 1160 receives the short-circuit detection output signal Sds, the output terminal of the first inverter 1160 is connected to the input terminal of the second inverter 1170, and the output terminal of the second inverter 1170 is connected to the control terminal of the first switch 340. Thus, the control terminal of the first switch 340 can receive the short-circuit detection output signal Sds through the first inverter 1160 and the second inverter 1170, and accordingly the transmission accuracy of the short-circuit detection output signal Sds can be improved.

The short-circuit protection circuit 250 includes a second switch 350. In the present embodiment, the second switch 350 is implemented by using an N-type MOSFET N3. The drain of the N-type MOSFET N3 is connected to the first terminal of the TSV 110 (i.e., the node A), the source of the N-type MOSFET N3 is connected to the ground voltage GND, and the gate of the N-type MOSFET N3 receives the short-circuit detection output signal Sds.

Because the input driving circuit 210 in FIG. 3 is implemented by using the signal inverter 310, the input signal Vin is inversed when it is transformed into the pending signal Va. The output logic circuit 140 disposed at the second chip CHIP2 includes an NOR gate 360 with two receiving terminals. The first receiving terminal and the second receiving terminal of the NOR gate 360 respectively receive the first transmission signal St1 at the node C and the second transmission signal St2 at the node D, and the NOR gate 360 outputs the corrected signal through the output terminal Vout.

The difference between the data path circuit 120 and the data path circuit 121 is that the input driving circuit 311 of the data path circuit 121 generates a pending signal Vb and transmits the pending signal Vb to the first terminal of the TSV 112 (i.e., the node B). The input driving circuit 211 of the data path circuit 121 is implemented by using a signal inverter 311, and the signal inverter 311 is composed of an N-type MOSFET N4 and a P-type MOSFET P4. The short-circuit detection circuit 221 is composed of a NOR gate 321, and the bias circuit 331 is composed of a resistor R2. The first switch 341 of the power control circuit 241 is composed of a P-type MOSFET P5, and the second switch 351 of the short-circuit protection circuit 251 is composed of an N-type MOSFET N5.

Based on that described above, the operation of the TSV repair circuit 100 illustrated in FIG. 3 can be reflected by following true value table (1):

TABLE (1)

| State | TSV 110 | TSV 112 | Vin | Va (A) | Vb (B) | St1 (C) | St2 (D) | Sds1 | Sds2 | Vout |
|---|---|---|---|---|---|---|---|---|---|---|
| 1 | Normal | Normal | 1 | 0 | 0 | 0 | 0 | 0 | 0 | 1 |
| 2 | Normal | Normal | 0 | 1 | 1 | 1 | 1 | 0 | 0 | 0 |
| 3 | Short-circuited | Normal | 1 | 0(Short-circuited) | 0 | 0 | 0 | 0 | 0 | 1 |
| 4 | Short-circuited | Normal | 0 | 0(Short-circuited) | 1 | 0 | 1 | 1 | 0 | 0 |
| 5 | Normal | Short-circuited | 1 | 0 | 0(Short-circuited) | 0 | 0 | 0 | 0 | 1 |
| 6 | Normal | Short-circuited | 0 | 1 | 0(Short-circuited) | 1 | 0 | 0 | 1 | 0 |
| 7 | Short-circuited | Short-circuited | 1 | 0(Short-circuited) | 0(Short-circuited) | 0 | 0 | 0 | 0 | 1 |
| 8 | Short-circuited | Short-circuited | 0 | 0(Short-circuited) | 0(Short-circuited) | 0 | 0 | 1 | 1 | 1 |

Referring to both FIG. 3 and foregoing table (1), states 1 and 2 represent the normal state of the TSVs 110 and 112 (i.e., no short circuit is produced between the TSVs 110 and 112 and the silicon substrate). Herein due to the signal inverters 310 and 311 in the input driving circuits 210 and 211, the pending signals Va and Vb are inverse to the input signal Vin.

In the state 1, the input signal Vin is logic "1", and both the pending signals Va and Vb are logic "0". Thus, the short-circuit detection output signals Sds1 and Sds2 respectively generated by the NOR gates 320 and 321 of the short-circuit detection circuits 220 and 221 are both logic "0". Accordingly, the power control circuits 240 and 241 continue to supply a voltage (for example, the supply voltage VDD) to the input driving circuits 310 and 311, and the short-circuit protection circuits 250 and 251 are turned off. To be specific, the P-type MOSFETs P3 and P5 served as the first switches 340 and 341 are turned on, so that the supply voltage VDD is guided to the input driving circuits 210 and 211 to continuously transform the input signal Vin into the pending signals Va and Vb. On the other hand, the N-type MOSFETs N3 and N5 served as the second switches 350 and 351 are turned off, so that the nodes A and B are not connected to the ground. Moreover, the NOR gate 360 of the output logic circuit 140 generates a correct output signal Vout (logic "1") because both the transmission signals St1 and St2 are logic "0".

In the state 2, the input signal Vin is logic "0", and both the pending signals Va and Vb are logic "1". Thus, the short-circuit detection output signals Sds1 and Sds2 respectively generated by the NOR gates 320 and 321 of the short-circuit detection circuits 220 and 221 are logic "0". Accordingly, the first switches 340 and 341 are both turned on and the second switches 350 and 351 are both turned off. Because the two transmission signals St1 and St2 are both logic "1", the output logic circuit 140 generates an output signal Vout (logic "0").

States 3 and 4 represent a short-circuited state of the TSV 110 (i.e., a short circuit is produced between the TSV 110 and the silicon substrate while the TSV 112 is in a normal state). In this case, the voltage levels on the pending signal Va (node A) and the first transmission signal St1 (node C) are pulled down to logic "0" due to the short circuit of the TSV 110. In the state 3, the input signal Vin is logic "1". Because the pending signal Va in state 3 is logic "0", the operation of the TSV repair circuit 100 is the same as that in the state 1, and the output logic circuit 140 also generates a correct output signal Vout (logic "1"), just as in state 1.

In the state 4, the input signal Vin is logic "0", and the voltage levels on the pending signal Va and the first transmission signal St1 are pulled down to logic "0" due to the short circuit, and the pending signal Vb is still logic "1" (i.e., inverse to the input signal Vin). Thus, the short-circuit detection output signal Sds1 generated by the NOR gate 320 is logic "1", and the short-circuit detection output signal Sds2 generated by the NOR gate 321 is logic "0". Accordingly, the P-type MOSFET P3 served as the first switch 340 is turned off, and the supply voltage VDD is not supplied to the input driving circuit 210 anymore to prevent the production of any leakage current. On the other hand, the N-type MOSFET N3 served as the second switch 350 is turned on so that the leakage current which is about to enter the TSV 110 is guided to the ground. The operation of the first switch 341 and the second switch 351 are the same as that in the state 2. Thus, in the state 4, the NOR gate 360 of the output logic circuit 140 respectively receives the first transmission signal St1 (logic "0") and the second transmission signal St2 (logic "1") to allow the NOR gate 360 to generate a correct output signal Vout (logic "0").

States 5 and 6 represent the normal state of the TSV 110 and the short-circuited state of the TSV 112 (i.e., a short circuit is produced between the TSV 112 and the silicon substrate only). Herein the voltage levels on the pending signal Vb (node B) and the second transmission signal St2 (node D) are pulled down to logic "0" due to the short circuit of the TSV 112. In the state 5, the input signal Vin is logic "1". Because the pending signal Vb in the state 5 is logic "0" (i.e., inverse to the input signal Vin), the operation of the TSV repair circuit 100 is the same as that in the state 1, and the NOR gate 360 also generates a correct output signal Vout (logic "1").

In the state 6, the input signal Vin is logic "0", and the voltage levels on the pending signal Vb and the second transmission signal St2 are pulled down to logic "0" due to the short circuit, and the pending signal Va is still logic "1" (i.e., inverse to the input signal Vin). Thus, the short-circuit detection output signal Sds2 generated by the NOR gate 321 is logic "1", and the P-type MOSFET P5 served as the first switch 341 is turned off, so that the supply voltage VDD is not supplied to the input driving circuit 211 anymore. Accordingly, the N-type MOSFET N5 served as the second switch 351 is turned on, so that the leakage current which is about to enter the TSV 112 is guided to the ground. The operation of the first switch 340 and the second switch 350 are the same as that in the state 2. Thus, the NOR gate 360 respectively receives the first transmission signal St1 (logic "1") and the second transmission signal St2 (logic "0") to allow the NOR gate 360 to generate a correct output signal Vout (logic "0").

States 7 and 8 represent the short-circuited state of both the TSVs 110 and 112. In the state 7, the input signal Vin is logic "1". Because the pending signals Va and Vb are originally logic "0" (inverse to the input signal Vin), the operation of the TSV repair circuit 100 is the same as that in the state 1, and the output logic circuit 140 also generates a correct output signal Vout (logic "1"), just as that in state 1.

It should be noted that in the state 8, because the input signal Vin is logic "0" and the voltage levels on the pending signals Va and Vb and the transmission signals St1 and St2 are all pulled down to logic "0" due to the short circuit, the short-circuit detection output signals Sds1 and Sds2 respectively generated by the NOR gates 320 and 321 are both logic "1". Accordingly the P-type MOSFETs P3 and P5 are turned off, and the supply voltage VDD is not supplied to the input driving circuits 210 and 211 anymore. On the other hand, the N-type MOSFETs N3 and N5 are turned on, so that the leakage current which is about to enter the TSVs 110 and 112 is guided to the ground. In addition, the NOR gate 360 respectively receive an incorrect first transmission signal St1 (logic "0") and an incorrect second transmission signal St2 (logic "0"), so that the NOR gate 360 cannot self-repair and generates an incorrect output signal Vout (logic "1"). Even though the TSV repair circuit 100 in FIG. 3 cannot perform a correct data self-repair mechanism regarding the state 8 in foregoing table (1), the problem mentioned above can be resolved by adding another data path circuit and corresponding TSVs.

Figure 5:
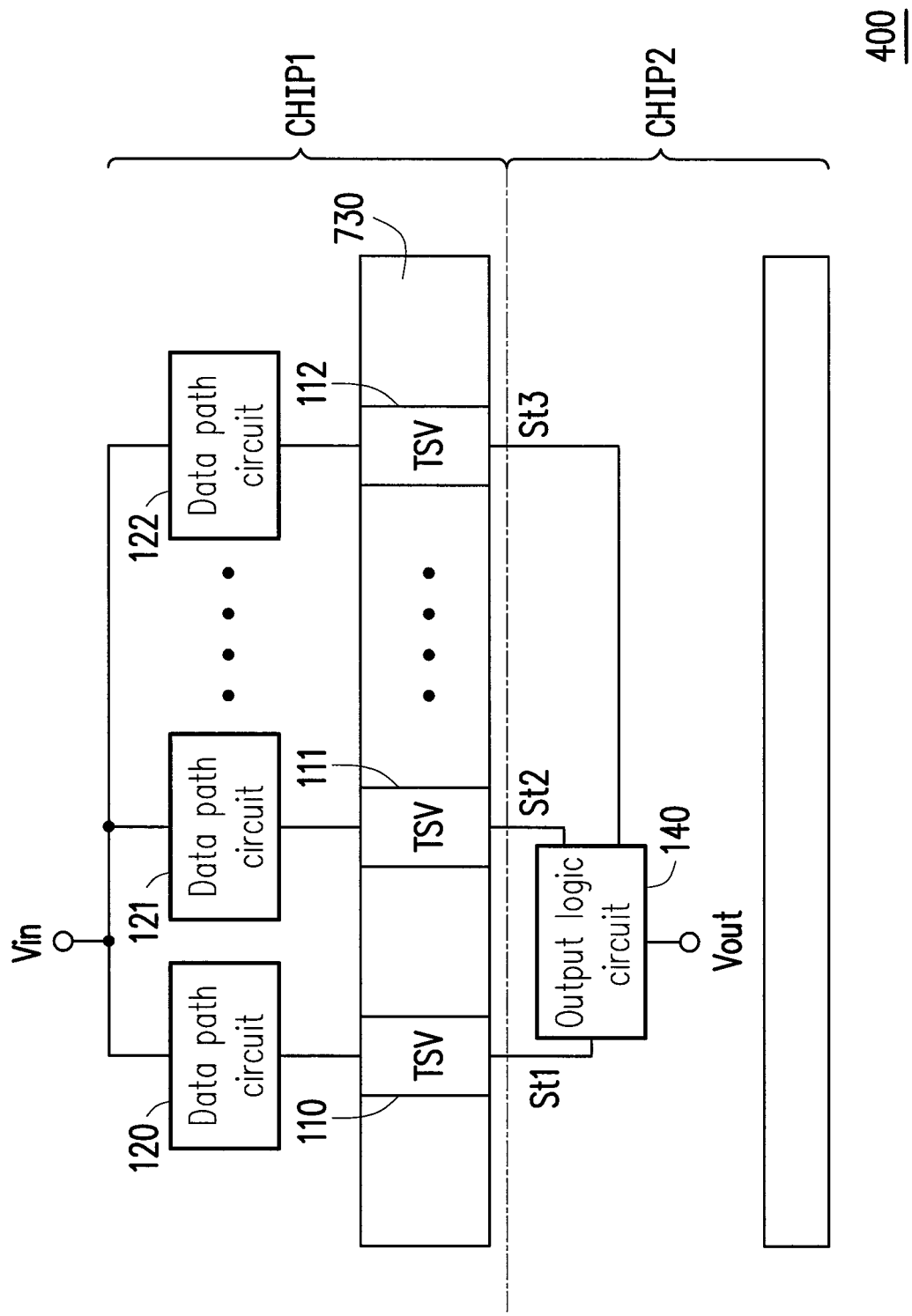
FIG. 5 is a diagram of a TSV repair circuit of a semiconductor apparatus according to a second embodiment of the disclosure.

FIG. 5 is a diagram of a TSV repair circuit 400 of a semiconductor apparatus according to a second embodiment of the disclosure. The TSV repair circuit 400 in the present embodiment is similar to the TSV repair circuit 100 described in foregoing embodiment, and the major difference between the two embodiments is that the TSV repair circuit 400 is implemented with three or more data paths (i.e., three or more data path circuits 120-122 with TSVs 110-112 running through a silicon substrate 730). Namely, in the present embodiment, the problem of short circuit between all the TSVs and the silicon substrate can be resolved by increasing the numbers of TSVs and data path circuits. In other words, in the present embodiment, the output logic circuit 140 can restore the output signal Vout through a NOR gate thereof as long as a correct signal is transmitted to the output logic circuit 140 through one of the data paths.

Figure 6:
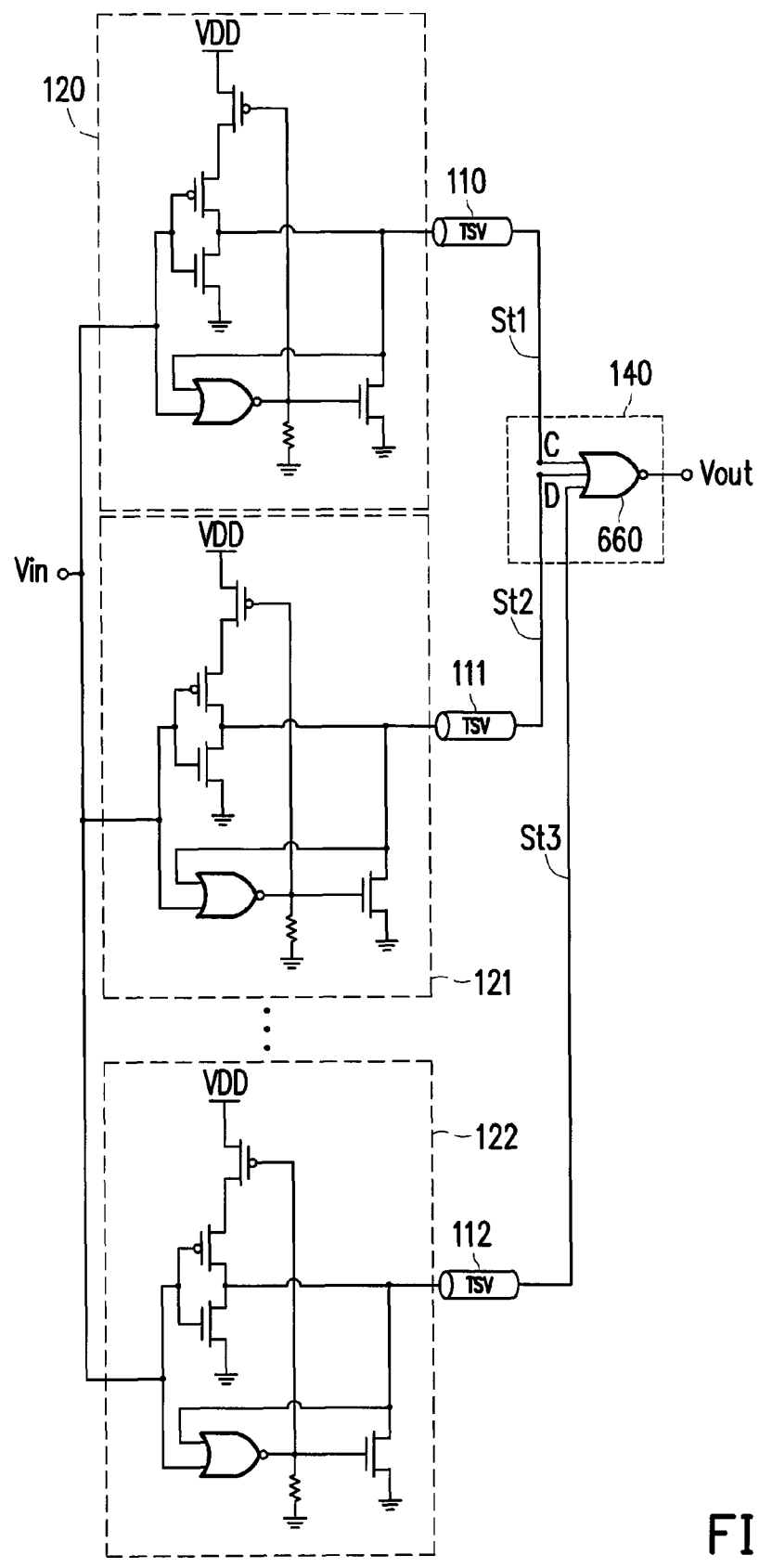
FIG. 6 is a circuit diagram of a TSV repair circuit of a semiconductor apparatus according to the second embodiment of the disclosure.

FIG. 6 is a circuit diagram of the TSV repair circuit 400 of a semiconductor apparatus according to the second embodiment of the disclosure. In other words, FIG. 6 is a circuit diagram of the TSV repair circuit 400 in FIG. 5. The TSV repair circuit 400 in FIG. 6 has three data paths (i.e., three data path circuits 120-122 with corresponding TSVs 110-112) for transmitting the input signal Vin, such that the second terminals of the TSVs 110-112 respectively generate a plurality of transmission signals St1-St3. The output logic circuit 140 includes a NOR gate 660 with three receiving terminals. The first, second, and third receiving terminal of the NOR gate 660 respectively receive the first, second, and third transmission signals St1-St3, and the output terminal of the NOR gate 660 generates the output signal Vout. Those operations and functions not mentioned in the third embodiment can be referred to the embodiments described above therefore will not be described herein.

Figure 7:
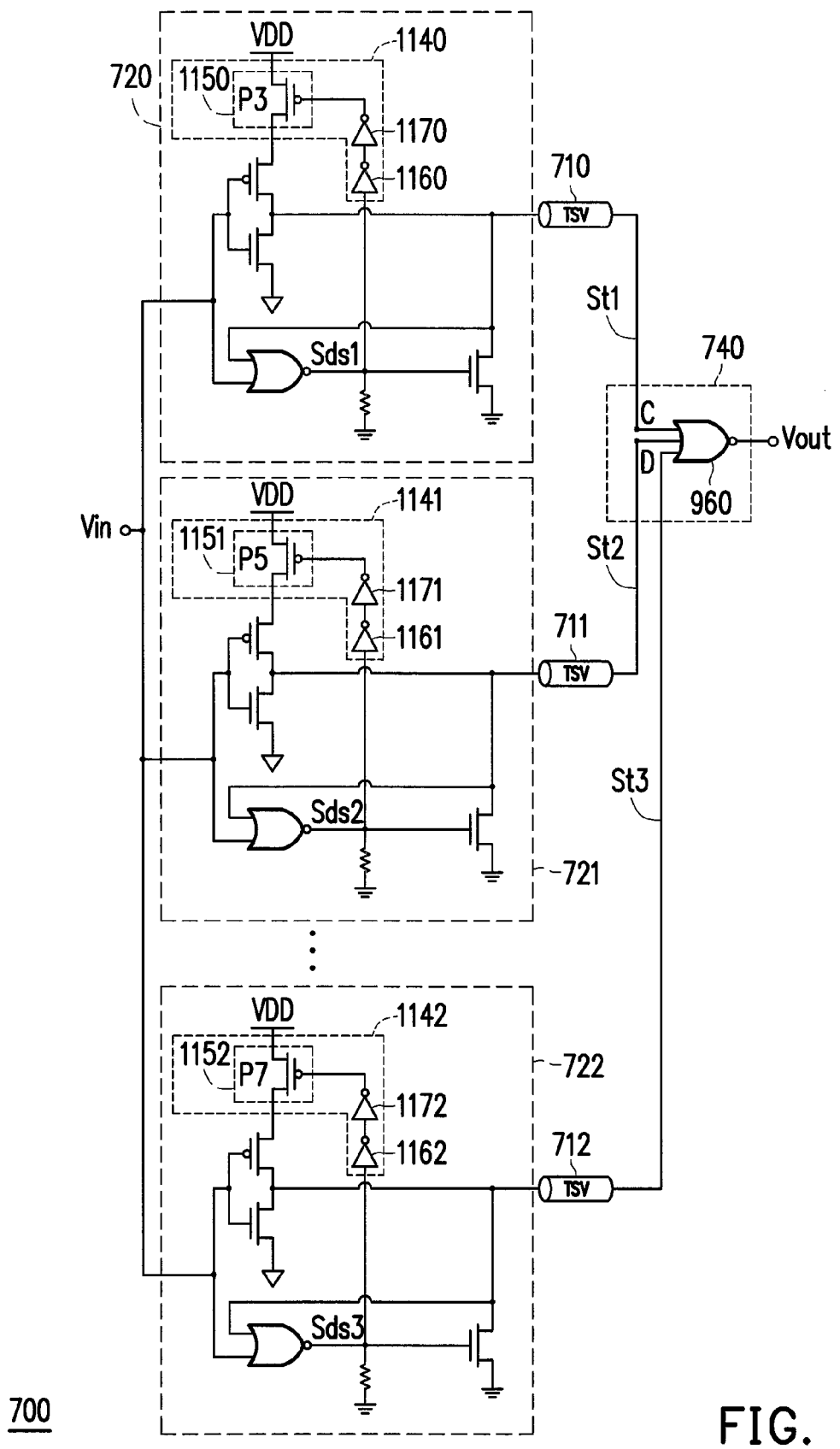
FIG. 7 is a circuit diagram of a TSV repair circuit of a semiconductor apparatus according to a third embodiment of the disclosure.

FIG. 7 is a circuit diagram of a TSV repair circuit 700 of a semiconductor apparatus according to a third embodiment of the disclosure. The difference between the embodiments respectively illustrated in FIG. 7 and FIG. 6 is that in the TSV repair circuit 700, the data path circuits 720-722 further respectively include the first inverters 1160-1162 and the second inverters 1170-1172 besides the first switches 1150-1152 in the power control circuits 1140-1142. The control terminals of the first switches 1150-1152 respectively receive the short-circuit detection output signals Sds1-Sds3 through the first inverters 1160-1162 and the second inverters 1170-1172, s that the transmission accuracy of the short-circuit detection output signals Sds1-Sds3 is improved.

Figure 8:
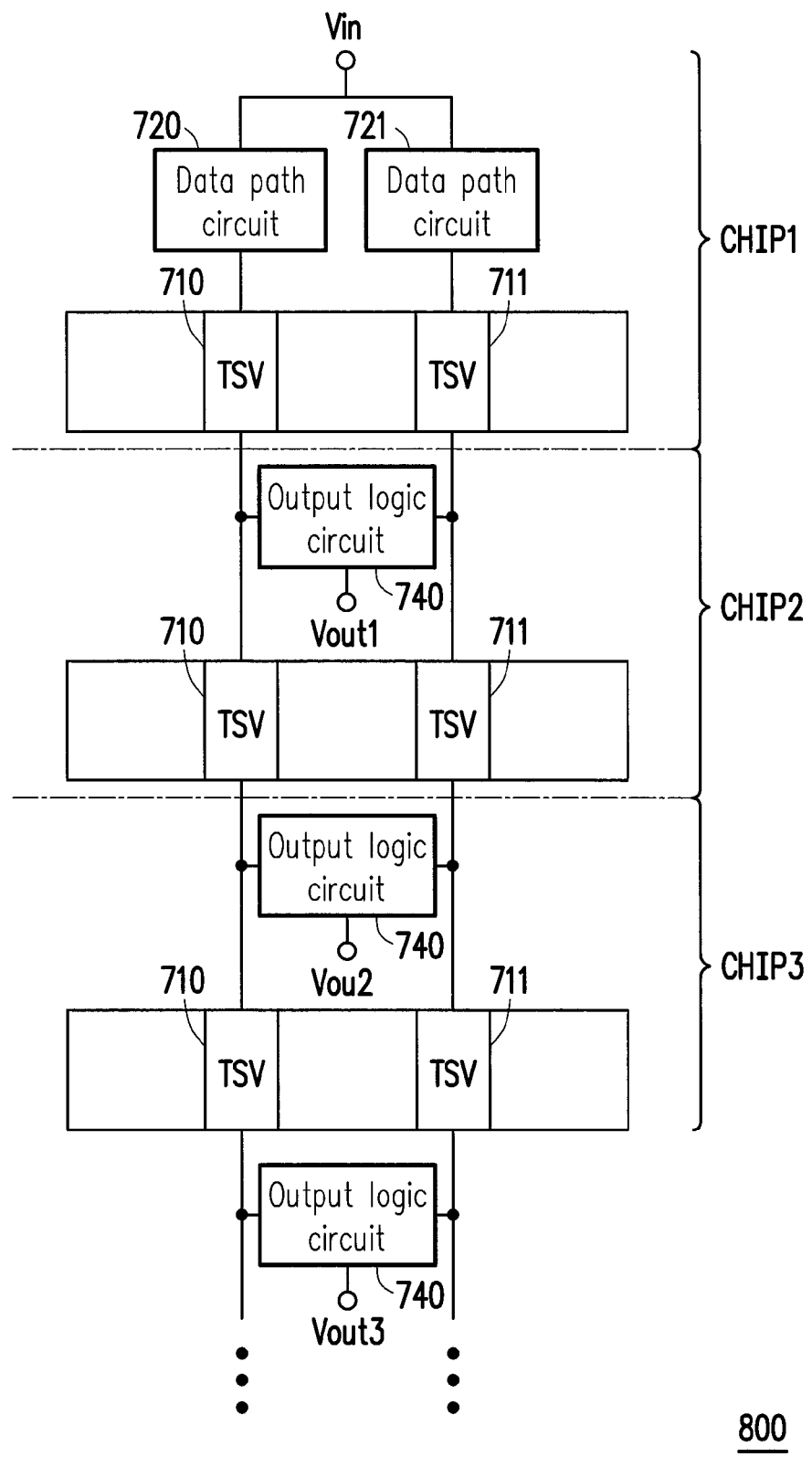
FIG. 8 is a diagram of a TSV repair circuit of a semiconductor apparatus according to a fourth embodiment of the disclosure.

FIG. 8 is a diagram of a TSV repair circuit 800 of a semiconductor apparatus according to a fourth embodiment of the disclosure. The TSV repair circuit 800 is very flexible in the application of the 3DIC technology and can be applied when multiple chips are stacked. For example, the data path circuits 720 and 721 in the TSV repair circuit 800 are not limited to being disposed on the topmost chip. Instead, they can be disposed on any chip. The output logic circuit 740 in FIG. 8 can be disposed on the second chip CHIP2 and a third chip CHIP3 or on any number of chips, so that the output logic circuit 740 can generate a plurality of output signals Vout1-Vout3 on different chips. Accordingly, the first chip CHIP1 can properly transmit the input signal Vin to the second chip CHIP2, the third chip CHIP3, and/or any other chips. The second chip CHIP2 not disposed with the data path circuits and the adjacent chips (for example, the third chip CHIP3) transmit data to each other through the TSVs 710 and 711 running through the silicon substrate.

Figure 9:
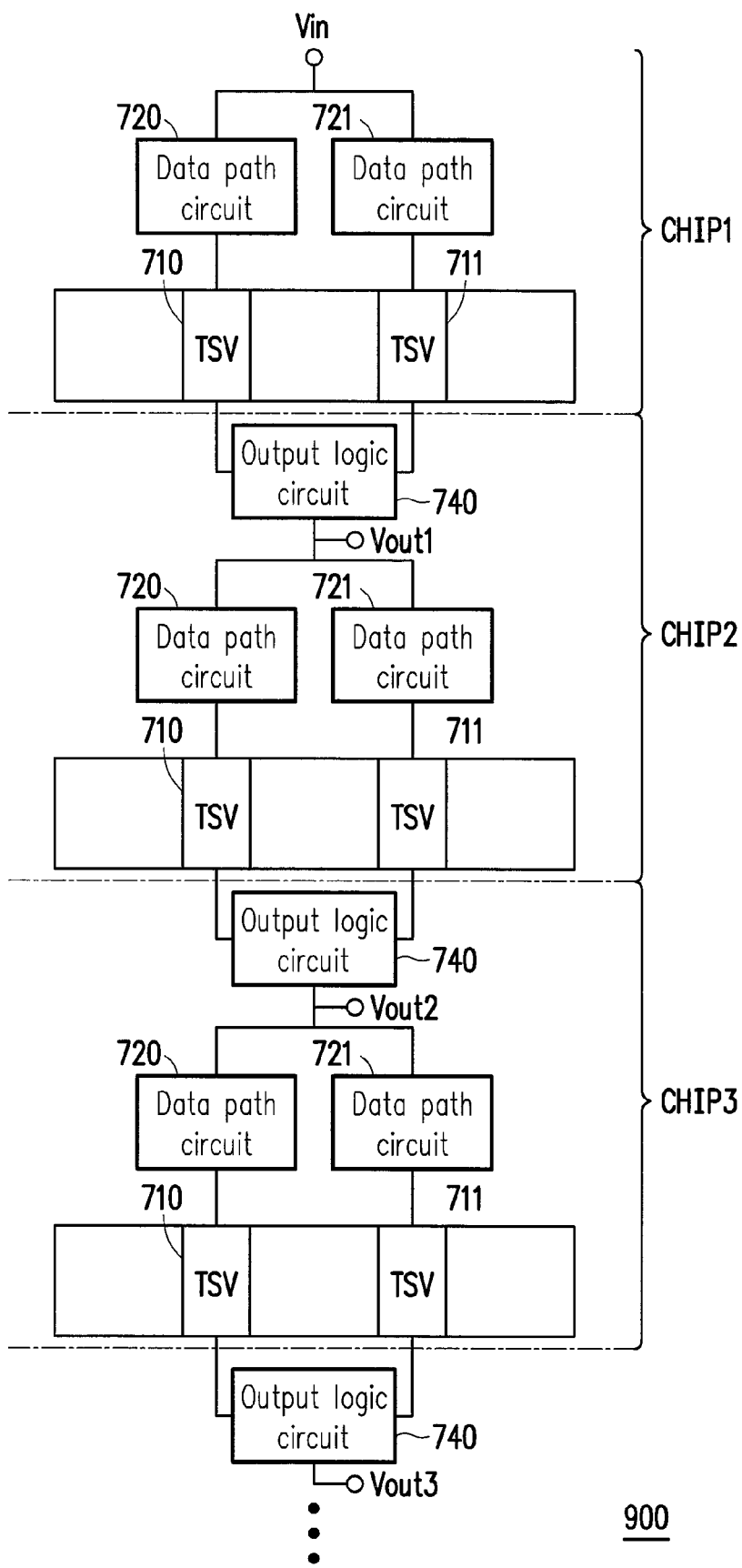
FIG. 9 is a diagram of a TSV repair circuit of a semiconductor apparatus according to a fifth embodiment of the disclosure.

FIG. 9 is a diagram of a TSV repair circuit 900 according to a fifth embodiment of the disclosure. In the TSV repair circuit 900 of the present embodiment, the data path circuits 720 and 721 and the output logic circuit 740 are disposed on each chip, and the output logic circuits 740 on different chips respectively generate a plurality of output signals Vout1-Vout3. The circuit structure is illustrated in FIG. 9. Based on the circuit structure in FIG. 9, the input signal Vin can be properly transmitted from the first chip CHIP1 to the chip CHIP2 or CHIP3 as long as the TSVs 710 and 711 disposed on the same CHIP1, CHIP2, or CHIP3 are not short-circuited at the same time. If the TSVs 710 and 711 disposed on the same chip are both short-circuited, in the present embodiment, the problem of signal transmission error on both data paths can be resolved by disposing one or more additional data paths. The input terminals of the data path circuits 720 and 721 disposed in each chip are connected to the output terminal of the output logic circuit 740 in the chip.

As described above, in a data transmission apparatus provided by an embodiment of the disclosure, a short circuit between a TSV and a silicon substrate is detected according to an input signal and the voltage level on a first terminal of the TSV, and when the short circuit is detected, a supply voltage is instantly shut off and the first terminal of the TSV is connected to a ground voltage, so that a leakage current is prevented from entering the silicon substrate and the voltage level on the silicon substrate is prevented from drifting. In addition, in a TSV repair circuit provided by an embodiment of the disclosure, besides adopting the circuit structure of the data transmission apparatus described above to achieve the same purpose, an output logic circuit is further disposed on a receiving chip, so that a plurality of transmitted signals can be restored into correct signals, and a 3DIC can work properly even when some TSVs are short-circuited.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A through silicon via (TSV) repair circuit of a semiconductor apparatus, comprising:

a first chip and at least one second chip, wherein the first chip and the at least one second chip are vertically stacked;

at least two TSVs, running through a silicon substrate for transmitting data between the first chip and the at least one second chip;

at least two data path circuits, disposed at the first chip, and respectively connected to the at least two TSVs, wherein each of the at least two data path circuits comprises:

an input driving circuit, receiving an input signal, transforming the input signal into a pending signal according to a first level voltage and a second level voltage, and transmitting the pending signal to a first terminal of the corresponding TSV;

a short-circuit detection circuit, connected to the first terminal of the corresponding TSV, detecting a short circuit between the corresponding TSV and the silicon substrate according to the input signal and the first terminal of the corresponding TSV, and generating a short-circuit detection output signal; and a leakage current cancellation circuit, connected to the short-circuit detection circuit and the input driving circuit, and preventing a leakage current produced by the first level voltage from entering the silicon substrate according to the short-circuit detection output signal; and an output logic circuit, disposed at the at least one second chip, wherein at least two input terminals of the output logic circuit are respectively connected to second terminals of at least one of the TSVs for respectively receiving a plurality of transmission signals, and the output logic circuit generates an output signal according to the transmission signals.

2. The TSV repair circuit according to claim 1, wherein the leakage current cancellation circuit comprises:

a power control circuit, connected to the short-circuit detection circuit, and determining not to supply the first level voltage according to the short-circuit detection output signal.

3. The TSV repair circuit according to claim 2, wherein the power control circuit comprises:

a first switch, having a first terminal for receiving the first level voltage, having a second terminal connected to a power supply terminal of the input driving circuit, and having a control terminal for receiving the short-circuit detection output signal.

4. The TSV repair circuit according to claim 3, wherein the power control circuit further comprises:

a first inverter and a second inverter, wherein the control terminal of the first switch receives the short-circuit detection output signal through the first inverter and the second inverter.

5. The TSV repair circuit according to claim 1, wherein the leakage current cancellation circuit comprises:

a short-circuit protection circuit, connected to the short-circuit detection circuit and the corresponding TSV, and determining to connect the first terminal of the corresponding TSV to the second level voltage according to the short-circuit detection output signal, wherein the first level voltage is greater than the second level voltage.

6. The TSV repair circuit according to claim 5, wherein the short-circuit protection circuit comprises:

a second switch, having a first terminal connected to the first terminal of the corresponding TSV, having a second terminal connected to the second level voltage, and having a control terminal for receiving the short-circuit detection output signal.

7. The TSV repair circuit according to claim 1, wherein the input driving circuit comprises:

a signal inverter, having a first terminal for receiving the input signal, having a power supply terminal for receiving the first level voltage, and having an output terminal connected to the first terminal of the corresponding TSV, wherein the pending signal is inverse to the input signal.

8. The TSV repair circuit according to claim 7, wherein the signal inverter comprises:

a first N-type MOSFET and a first P-type MOSFET, wherein control terminals of the first N-type MOSFET and the first P-type MOSFET receive the input signal, a first terminal of the first P-type MOSFET receives the first level voltage, a second terminal of the first P-type MOSFET is connected to a first terminal of the first N-type MOSFET and serves as the output terminal of the signal inverter, and a second terminal of the first N-type MOSFET receives the second level voltage.

9. The TSV repair circuit according to claim 1, wherein the short-circuit detection circuit comprises:

a NOR gate, having a first receiving terminal connected to the first terminal of the corresponding TSV, having a second receiving terminal for receiving the input signal, and having an output terminal for generating the short-circuit detection output signal.

10. The TSV repair circuit according to claim 1 further comprising:

a bias circuit, having a first terminal connected to an output terminal of the short-circuit detection circuit, and maintaining a bias of the short-circuit detection output signal.

11. The TSV repair circuit according to claim 10, wherein the bias circuit comprises a biasing resistor, a first end of the biasing resistor is connected to the output terminal of the short-circuit detection circuit, and a second end of the biasing resistor receives the second level voltage.

12. The TSV repair circuit according to claim 10, wherein the bias circuit comprises a second N-type MOSFET, a first terminal and a control terminal of the second N-type MOSFET are connected to the output terminal of the short-circuit detection circuit, and a second terminal of the second N-type MOSFET receives the second level voltage.

13. The TSV repair circuit according to claim 10, wherein the bias circuit comprises a second P-type MOSFET, a first terminal of the second P-type MOSFET is connected to the output terminal of the short-circuit detection circuit, and a second terminal and a control terminal of the second P-type MOSFET receive the second level voltage.

14. The TSV repair circuit according to claim 1, wherein the at least two TSVs comprise at least one first TSV and at least one second TSV, and the at least two data path circuits comprise a first data path circuit and a second data path circuit, wherein the first data path circuit and the second data path circuit are respectively connected to the first terminals of the at least one first TSV and the at least one second TSV, and the second terminals of the at least one first TSV and the at least one second TSV respectively transmit a first transmission signal and a second transmission signal to a first receiving terminal and a second receiving terminal of the output logic circuit.

15. The TSV repair circuit according to claim 14, wherein the output logic circuit comprises:

output first NOR gate, having a first receiving terminal and a second receiving terminal for respectively receiving the first transmission signal and the second transmission signal, and having an output terminal for generating the output signal.

16. The TSV repair circuit according to claim 14, wherein the at least two TSVs further comprise at least one third TSV, and the at least two data path circuits further comprise a third data path circuit, wherein the third data path circuit is connected to the first terminal of the at least one third TSV, and the second terminal of the at least one third TSV transmits a third transmission signal to a third receiving terminal of the output logic circuit.

17. The TSV repair circuit according to claim 16, wherein the output logic circuit comprises:

an output second NOR gate, having a first receiving terminal, a second receiving terminal, and a third receiving terminal for respectively receiving the first transmission signal, the second transmission signal, and the third transmission signal, and having an output terminal for generating the output signal.

18. A through silicon via (TSV) repair circuit of a semiconductor apparatus, comprising:

a plurality of chips, wherein the chips are vertically stacked;

at least two TSVs, running through a silicon substrate for transmitting data among the chips;

at least two data path circuits, disposed at at least one of the chips, and respectively connected to the at least two TSVs, wherein the chips not disposed with the at least two data path circuits and the adjacent chips transmit data to each other through the at least two TSVs running through the silicon substrate, wherein each of the at least two data path circuits comprises:

an input driving circuit, receiving an input signal, transforming the input signal into a pending signal according to a first level voltage and a second level voltage, and transmitting the pending signal to a first terminal of the corresponding TSV;

a short-circuit detection circuit, connected to the first terminal of the corresponding TSV, detecting a short circuit between the corresponding TSV and the silicon substrate according to the input signal and the first terminal of the corresponding TSV, and generating a short-circuit detection output signal; and a leakage current cancellation circuit, connected to the short-circuit detection circuit and the input driving circuit, and preventing a leakage current produced by the first level voltage from entering the silicon substrate according to the short-circuit detection output signal; and an output logic circuit, disposed at at least one of the chips, wherein at least two input terminals of the output logic circuit are respectively connected to second terminals of at least one of the TSVs for respectively receiving a plurality of transmission signals, and the output logic circuit generates an output signal according to the transmission signals.

19. The TSV repair circuit according to claim 18, wherein the at least two TSVs comprise at least one first TSV and at least one second TSV, and the at least two data path circuits comprise a first data path circuit and a second data path circuit, wherein the first data path circuit and the second data path circuit are respectively connected to the first terminals of the at least one first TSV and the at least one second TSV, and the second terminals of the at least one first TSV and the at least one second TSV respectively transmit a first transmission signal and a second transmission signal to a first receiving terminal and a second receiving terminal of the output logic circuit.

20. The TSV repair circuit according to claim 19, wherein the output logic circuit comprises:

an output first NOR gate, having a first receiving terminal and a second receiving terminal for respectively receiving the first transmission signal and the second transmission signal, and having an output terminal for generating the output signal.

21. The TSV repair circuit according to claim 19, wherein the at least two TSVs further comprise at least one third TSV, and the at least two data path circuits further comprise a third data path circuit, wherein the third data path circuit is connected to the first terminal of the at least one third TSV, and the second terminal of the at least one third TSV transmits a third transmission signal to a third receiving terminal of the output logic circuit.

22. The TSV repair circuit according to claim 21, wherein the output logic circuit comprises:

an output second NOR gate, having a first receiving terminal, a second receiving terminal, and a third receiving terminal for respectively receiving the first transmission signal, the second transmission signal, and the third transmission signal, and having an output terminal for generating the output signal.

23. The TSV repair circuit according to claim 18, wherein the leakage current cancellation circuit comprises:

a power control circuit, connected to the short-circuit detection circuit, and determining not to supply the first level voltage according to the short-circuit detection output signal.

24. The TSV repair circuit according to claim 23, wherein the power control circuit comprises:

a first switch, having a first terminal for receiving the first level voltage, having a second terminal connected to a power supply terminal of the input driving circuit, and having a control terminal for receiving the short-circuit detection output signal.

25. The TSV repair circuit according to claim 24, wherein the power control circuit further comprises:

a first inverter and a second inverter, wherein the control terminal of the first switch receives the short-circuit detection output signal through the first inverter and the second inverter.

26. The TSV repair circuit according to claim 18, wherein the leakage current cancellation circuit comprises:

a short-circuit protection circuit, connected to the short-circuit detection circuit and the corresponding TSV, and determining to connect the first terminal of the corresponding TSV to the second level voltage according to the short-circuit detection output signal, wherein the first level voltage is greater than the second level voltage.

27. The TSV repair circuit according to claim 26, wherein the short-circuit protection circuit comprises:

a second switch, having a first terminal connected to the first terminal of the corresponding TSV, having a second terminal connected to the second level voltage, and having a control terminal for receiving the short-circuit detection output signal.

28. The TSV repair circuit according to claim 18 further comprising:

a bias circuit, having a first terminal connected to an output terminal of the short-circuit detection circuit, and maintaining a bias of the short-circuit detection output signal.

29. The TSV repair circuit according to claim 28, wherein the bias circuit comprises a biasing resistor, a first end of the biasing resistor is connected to the output terminal of the short-circuit detection circuit, and a second end of the biasing resistor receives the second level voltage.

30. The TSV repair circuit according to claim 28, wherein the bias circuit comprises a second N-type MOSFET, a first terminal and a control terminal of the second N-type MOSFET are connected to the output terminal of the short-circuit detection circuit, and a second terminal of the second N-type MOSFET receives the second level voltage.

31. The TSV repair circuit according to claim 28, wherein the bias circuit comprises a second P-type MOSFET, a first terminal of the second P-type MOSFET is connected to the output terminal of the short-circuit detection circuit, and a second terminal and a control terminal of the second P-type MOSFET receive the second level voltage.

32. A through silicon via (TSV) repair circuit of a semiconductor apparatus, comprising:
a plurality of chips, wherein the chips are stacked;
a plurality of TSVs, running through a silicon substrate for transmitting data among the chips;
a plurality of data path circuits, disposed at each of the chips, and respectively connected to the TSVs, wherein each of the data path circuits comprises:
an input driving circuit, receiving an input signal, transforming the input signal into a pending signal according to a first level voltage and a second level voltage, and transmitting the pending signal to a first terminal of the corresponding TSV;
a short-circuit detection circuit, connected to the first terminal of the corresponding TSV, detecting a short circuit between the corresponding TSV and the silicon substrate according to the input signal and the first terminal of the corresponding TSV, and generating a short-circuit detection output signal; and
a leakage current cancellation circuit, connected to the short-circuit detection circuit and the input driving circuit, and preventing a leakage current produced by the first level voltage from entering the silicon substrate according to the short-circuit detection output signal; and
at least one output logic circuit, respectively disposed at the chips, wherein an input terminal of the at least one output logic circuit is respectively connected to second terminals of the TSV for respectively receiving a plurality of transmission signals, and the at least one output logic circuit generates an output signal according to the transmission signals,
wherein input terminals of the data path circuits in the chips are connected to an output terminal of the at least one output logic circuit in the chips.

33. The TSV repair circuit according to claim 32, wherein the TSVs comprise at least one first TSV and at least one second TSV, and the data path circuits comprise a first data path circuit and a second data path circuit,
wherein the first data path circuit and the second data path circuit are respectively connected to the first terminals of the at least one first TSV and the at least one second TSV, and the second terminals of the at least one first TSV and the at least one second TSV respectively transmit a first transmission signal and a second transmission signal to a first receiving terminal and a second receiving terminal of the output logic circuit.

34. The TSV repair circuit according to claim 33, wherein the output logic circuit comprises:
an output first NOR gate, having a first receiving terminal and a second receiving terminal for respectively receiving the first transmission signal and the second transmission signal, and having an output terminal of the output first NOR gate for generating the output signal.

35. The TSV repair circuit according to claim 33, wherein the TSVs further comprise at least one third TSV, and the data path circuits further comprise a third data path circuit,
wherein the third data path circuit is connected to the first terminal of the at least one third TSV, and the second terminal of the at least one third TSV transmits a third transmission signal to a third receiving terminal of the output logic circuit.

36. The TSV repair circuit according to claim 35, wherein the output logic circuit comprises:
an output second NOR gate, having a first receiving terminal, a second receiving terminal, and a third receiving terminal for respectively receiving the first transmission signal, the second transmission signal, and the third transmission signal, and having an output terminal for generating the output signal.

37. The TSV repair circuit according to claim 32, wherein the leakage current cancellation circuit comprises:
a power control circuit, connected to the short-circuit detection circuit, and determining not to supply the first level voltage according to the short-circuit detection output signal.

38. The TSV repair circuit according to claim 37, wherein the power control circuit comprises:
a first switch, having a first terminal for receiving the first level voltage, having a second terminal connected to a power supply terminal of the input driving circuit, and having a control terminal for receiving the short-circuit detection output signal.

39. The TSV repair circuit according to claim 38, wherein the power control circuit further comprises:
a first inverter and a second inverter, wherein the control terminal of the first switch receives the short-circuit detection output signal through the first inverter and the second inverter.

40. The TSV repair circuit according to claim 32, wherein the leakage current cancellation circuit comprises:
a short-circuit protection circuit, connected to the short-circuit detection circuit and the corresponding TSV, and determining to connect the first terminal of the corresponding TSV to the second level voltage according to the short-circuit detection output signal, wherein the first level voltage is greater than the second level voltage.

41. The TSV repair circuit according to claim 40, wherein the short-circuit protection circuit comprises:
a second switch, having a first terminal connected to the first terminal of the corresponding TSV, having a second terminal connected to the second level voltage, and having a control terminal for receiving the short-circuit detection output signal.

42. The TSV repair circuit according to claim 32 further comprising:
a bias circuit, having a first terminal connected to an output terminal of the short-circuit detection circuit, and maintaining a bias of the short-circuit detection output signal.

43. The TSV repair circuit according to claim 42, wherein the bias circuit comprises a biasing resistor, a first end of the biasing resistor is connected to the output terminal of the short-circuit detection circuit, and a second end of the biasing resistor receives the second level voltage.

44. The TSV repair circuit according to claim 42, wherein the bias circuit comprises a second N-type MOSFET, a first terminal and a control terminal of the second N-type MOSFET are connected to the output terminal of the short-circuit detection circuit, and a second terminal of the second N-type MOSFET receives the second level voltage.

45. The TSV repair circuit according to claim 44, wherein the bias circuit comprises a second P-type MOSFET, a first terminal of the second P-type MOSFET is connected to the output terminal of the short-circuit detection circuit, and a second terminal and a control terminal of the second P-type MOSFET receive the second level voltage.

* * * * *